(12) United States Patent
Tsai et al.

(10) Patent No.: US 10,930,565 B2
(45) Date of Patent: Feb. 23, 2021

(54) III-V CMOS CO-INTEGRATION

(71) Applicant: International Business Machines Corporation, Armonk, NY (US)

(72) Inventors: HsinYu Tsai, San Jose, CA (US); Renee T. Mo, Yorktown Heights, NY (US); Cheng-Wei Cheng, White Plains, NY (US); Ko-Tao Lee, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/178,110

(22) Filed: Nov. 1, 2018

(65) Prior Publication Data

US 2020/0144123 A1   May 7, 2020

(51) Int. Cl.

| | |
|---|---|
| *H01L 21/8238* | (2006.01) |
| *H01L 21/8258* | (2006.01) |
| *H01L 21/84* | (2006.01) |
| *H01L 21/02* | (2006.01) |
| *H01L 29/66* | (2006.01) |
| *H01L 29/78* | (2006.01) |
| *H01L 27/092* | (2006.01) |
| *H01L 27/12* | (2006.01) |
| *H01L 29/161* | (2006.01) |
| *H01L 29/20* | (2006.01) |
| *H01L 29/06* | (2006.01) |
| *H01L 21/8234* | (2006.01) |

(52) U.S. Cl.
CPC ........... *H01L 21/823807* (2013.01); *H01L 21/02546* (2013.01); *H01L 21/8258* (2013.01); *H01L 21/82385* (2013.01); *H01L 21/823431* (2013.01); *H01L 21/823821* (2013.01); *H01L 21/845* (2013.01); *H01L 27/0924* (2013.01); *H01L 27/1203* (2013.01); *H01L 27/1211* (2013.01); *H01L 29/0649* (2013.01); *H01L 29/161* (2013.01); *H01L 29/20* (2013.01); *H01L 29/66522* (2013.01); *H01L 29/66545* (2013.01); *H01L 29/66795* (2013.01); *H01L 29/785* (2013.01); *H01L 21/823412* (2013.01); *H01L 21/823418* (2013.01)

(58) Field of Classification Search
None
See application file for complete search history.

(56) References Cited

U.S. PATENT DOCUMENTS

| | | | |
|---|---|---|---|
| 8,486,770 B1 | 7/2013 | Wu et al. | |
| 8,859,355 B1 * | 10/2014 | Leobandung | H01L 29/785 257/E21.703 |
| 9,040,369 B2 | 5/2015 | Siddiqui et al. | |
| 9,515,073 B1 | 12/2016 | Jagannathan et al. | |

(Continued)

*Primary Examiner* — Andres Munoz
(74) *Attorney, Agent, or Firm* — Cantor Colburn LLP; Robert Sullivan

(57) ABSTRACT

A method of fabricating an n-type field effect transistor device (nFET) in a region of a wafer element is provided. The method includes forming a mandrel in the region and growing III-V semiconductor materials on the mandrel. The method also includes pulling the mandrel from a gate space in which a capped gate structure is formable and from source and drain (S/D) contact spaces and growing III-V semiconductor materials in the S/D contact spaces.

14 Claims, 4 Drawing Sheets

(56) References Cited

U.S. PATENT DOCUMENTS

| | | | |
|---|---|---|---|
| 9,590,085 B2* | 3/2017 | Leobandung | H01L 29/1033 |
| 9,640,667 B1 | 5/2017 | Balakrishnan et al. | |
| 9,754,843 B1 | 9/2017 | Patil et al. | |
| 9,911,739 B2 | 3/2018 | Cheng et al. | |
| 2004/0207019 A1 | 10/2004 | Bryant et al. | |
| 2008/0061371 A1 | 3/2008 | Kang et al. | |
| 2008/0242031 A1 | 10/2008 | Lee et al. | |
| 2013/0200454 A1 | 8/2013 | Anderson et al. | |
| 2013/0228864 A1 | 9/2013 | Mieno | |
| 2014/0264607 A1 | 9/2014 | Basu et al. | |
| 2014/0374800 A1* | 12/2014 | Cheng | H01L 29/785 |
| | | | 257/192 |
| 2017/0092763 A1* | 3/2017 | Cheng | H01L 29/66553 |
| 2017/0162447 A1 | 6/2017 | Glass et al. | |

* cited by examiner

III-V CMOS CO-INTEGRATION

BACKGROUND

The present invention generally relates to fabrication methods and resulting structures for semiconductor devices. More specifically, the present invention relates to III-V complementary-metal-oxide-semiconductor integration.

Complementary metal-oxide-semiconductor (CMOS) is a technology for constructing integrated circuits. CMOS is a technology that uses complementary and symmetrical pairs of p-type and n-type metal oxide semiconductor field effect transistors (MOSFETs) to implement logic functions. CMOS technology is used in microprocessors, microcontrollers, static RAM and other digital logic circuits. CMOS technology is also used for several analog circuits, such as image sensors (CMOS sensor), data converters and highly integrated transceivers for many types of communication.

Certain FETs can be provided as CMOS devices. In such cases, the FETs have a metal gate electrode placed on top of an oxide insulator, which in turn is on top of a semiconductor material.

SUMMARY

Embodiments of the present invention are directed to a method of fabricating an n-type field effect transistor device (nFET) in a region of a wafer element. A non-limiting example of the method includes forming a mandrel in the region and growing III-V semiconductor materials on the mandrel. The method also includes pulling the mandrel from a gate space in which a capped gate structure is formable and from source and drain (S/D) contact spaces and growing III-V semiconductor materials in the S/D contact spaces.

Embodiments of the present invention are directed to a method of fabricating a semiconductor device in p- and n-doped field effect transistor (NFET) regions of a wafer element. A non-limiting example of the method includes forming capped gate structures in the PFET region, growing III-V semiconductor materials on mandrel sidewalls in the NFET region while preventing III-V growth in the PFET region, pulling mandrels from gate spaces in which capped gate structures are formable in the NFET region and pulling the mandrels from source and drain (S/D) contact spaces in the NFET region. The non-limiting example of the method also includes growing III-V semiconductor materials in the S/D contact spaces in the NFET region while preventing III-V growth in the PFET region.

Embodiments of the invention are directed to a method of fabricating a semiconductor device in p- and n-doped field effect transistor (PFET and NFET) regions of a wafer element. A non-limiting example of the method includes forming fins and mandrels with dummy gates in the PFET and the NFET regions, respectively, and forming capped gate structures around the fins in the PFET region with the NFET region blocked. The non-limiting example of the method further includes growing III-V semiconductor materials on the mandrels in the NFET region while preventing III-V growth in the PFET region, pulling the mandrels from gate spaces in the NFET region, forming capped gate structures in the gate spaces, pulling the mandrels from source and drain (S/D) contact spaces in the NFET region and growing III-V semiconductor materials in the S/D contact spaces in the NFET region while preventing III-V growth in the PFET region.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
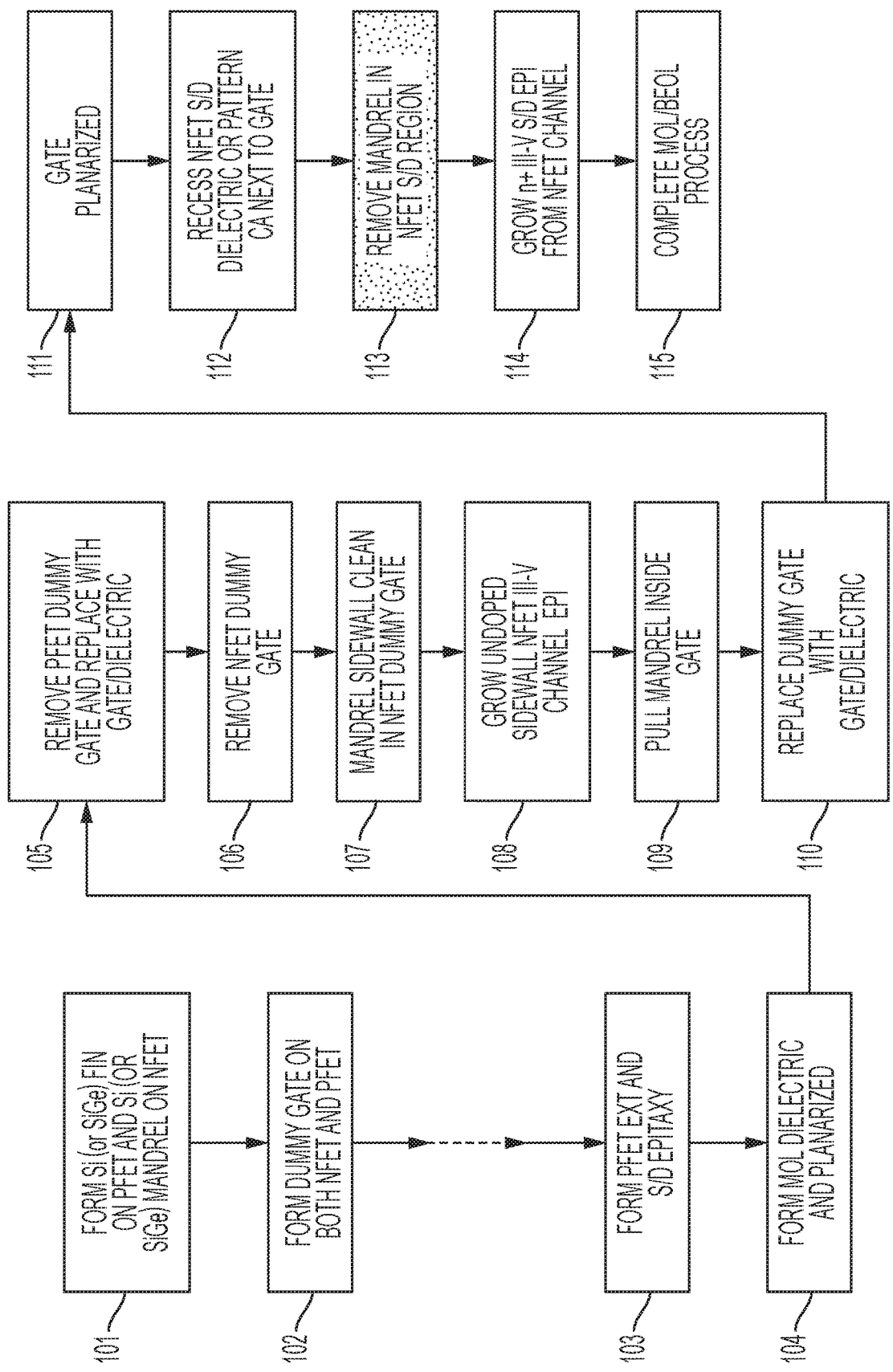
FIG. 1 is a flow diagram illustrating a method of fabricating a complementary-metal-oxide-semiconductor device in accordance with embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, III-V semiconductor materials have characteristically high electron mobility which makes these materials useful in CMOS device fabrication processes. Conversely, III-V semiconductor materials, such as Indium-Gallium-Arsenide (InGaAs), can be toxic and should only be introduced into the later stages of fabrication processes.

Turning now to an overview of the aspects of the invention, one or more embodiments of the invention address the above-described shortcomings of the prior art by providing for epitaxial growth of III-V semiconductor material channels directly from a mandrel sidewall. This is done following PFET replacement metal gate (RMG) processes within RMG trenches. In addition, the epitaxially grown source/drain (S/D) regions are completed after actual NFET gate formation. Thus, NFET processing is effectively executed as gate-first processing following the PFET RMG as the gate patterning processes.

The above-described aspects of the invention address the shortcomings of the prior art by providing for epitaxial growth of III-V semiconductor material channels following RMG so that the III-V semiconductor material growth is compatible with PFET processing, which requires high temperatures. In addition, a late direct growth sidewall channel flow provides for an NFET process that also avoids PFET high-k reliability annealing at high temperatures in the presence of III-V semiconductor materials.

Turning now to a more detailed description of aspects of the present invention, FIG. 1 depicts a method of fabricating a semiconductor device with p and n field effect transistor (PFET and NFET) regions. As shown in FIG. 1, the method includes patterning a fin of silicon, silicon germanium or another suitable material in the PFET region and forming a mandrel of silicon, silicon germanium or another suitable material in the NFET region (101). The patterning of the fin and the mandrel in the PFET and NFET regions, respectively, can be executed at a same time or sequentially by methods known to those skilled in the art. The method then includes a deposition and patterning of dummy gates formed of dielectric or semiconductor material or another suitable material over the fin and the mandrel in the PFET and NFET regions, respectively (102). At this point, the method could include an operation whereby the mandrel is removed from the NFET region but such mandrel removal can be delayed until later stages of the method.

The method further includes a blocking of the NFET region using, for example, oxide encapsulation and growth of PFET S/D epitaxy with optional thermal cycling for encouraging diffusion (103). Then, MOL dielectric, such as inter-layer dielectric (ILD), is deposited and planarized (104). At this point, the PFET gate region is opened and the dummy gate is pulled or removed from the PFET gate region and then replaced with a dielectric and gate (105). The replacement with the dielectric and gate of operation 105 can include a deposition of a PFET dielectric and a gate metal, a planarization of the gate material and the formation of an optional cap. The replacement with the gate and dielectric of operation 105 can also include a reliability anneal.

The method further includes a masking of the PFET region and a pull or removal of the NFET dummy gate from the NFET region (106). Then, sidewalls of the mandrel in the NFET region are cleaned (107) so that undoped sidewall NFET III-V semiconductor material channel epitaxy can be grown (108). Here, it is to be understood that III-V growth time can be shortened due to relatively short channel widths required for fins. That is, relatively short channel widths can ease epitaxial processes by providing for single nucleation sites that minimize spurious epitaxial growth on nitride or other similar surfaces.

The method further includes a pull or removal of the mandrel from inside the NFET dummy gate region (109) and a replacement of the dummy gate with a gate and a dielectric (110) by a deposition of the gate dielectric and a gate metal. Once the gate dielectric and the gate metal are deposited, the gate material is planarized and optionally capped (111). At this point, spaces for S/D contacts in the NFET region are recessed (112) and the mandrel can be pulled or removed from the NFET region (113).

Once the mandrel is pulled or removed from the NFET region in operation 113, n-type III-V semiconductor material is grown in the spaces for the S/D contacts from the channel (114) with the fill shape area needing to have a sufficient quantity of III-V semiconductor material in order to achieve proper loading. Finally, the method includes completion of the MOL and back-end-of-line (BEOL) processing (115).

Figure 2:
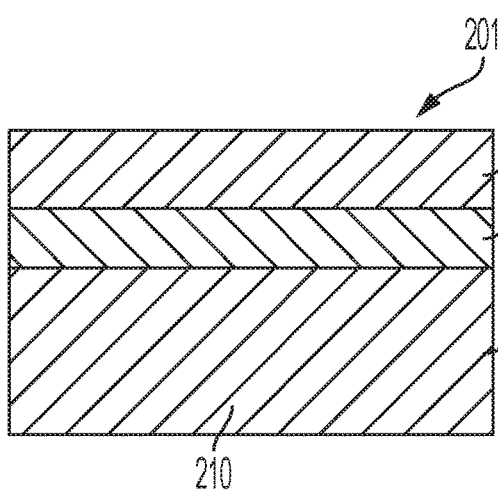
FIG. 2 is a cross-sectional view of an NFET region of a wafer element in accordance with embodiments of the present invention.
Figure 3:
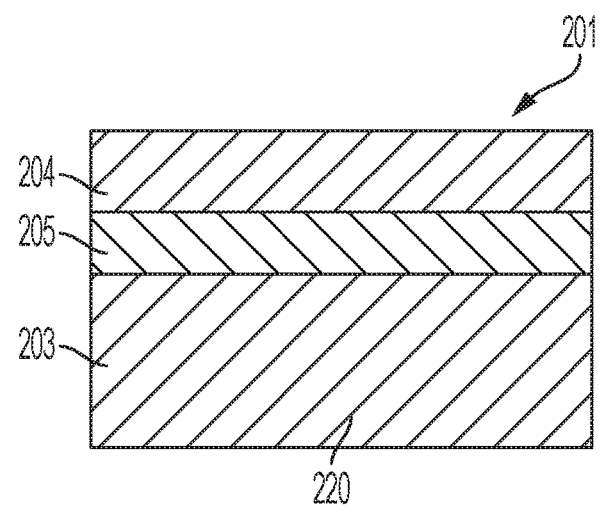
FIG. 3 is a cross-sectional view of a PFET region of a wafer element in accordance with embodiments of the present invention.

With reference to FIGS. 2 and 3, a wafer element 201 is provided with a silicon-on-insulator (SOI) structure 202 in the NFET region 210 and in the PFET region 220 or with a bulk wafer structure. The SOI structure includes a semiconductor substrate 203, a semiconductor layer 204 and an insulator layer 205 interposed between the semiconductor substrate 302 and the semiconductor layer 204.

Figure 4:
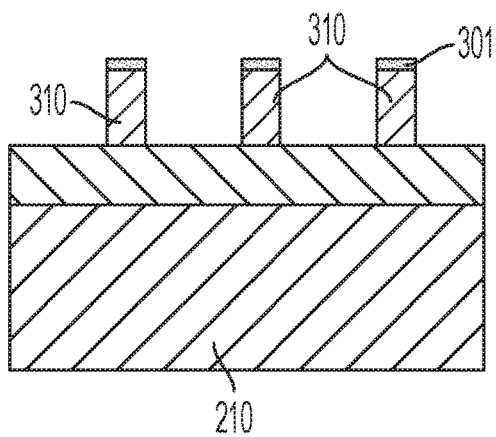
FIG. 4 is a cross-sectional view of mandrels in an NFET region of a wafer element in accordance with embodiments of the present invention.
Figure 5:
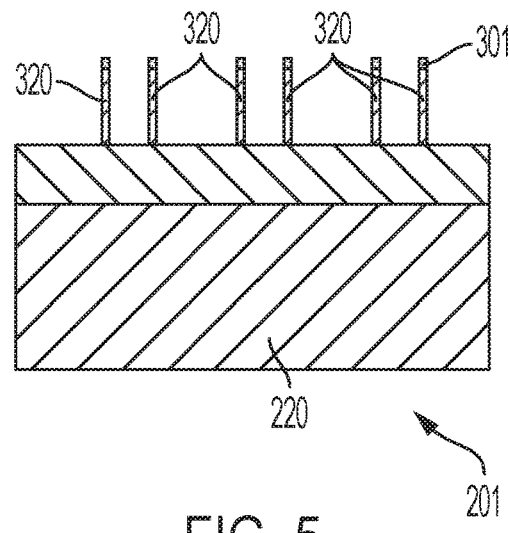
FIG. 5 is a cross-sectional view of fins in a PFET region of a wafer element in accordance with embodiments of the present invention.

With reference to FIGS. 4 and 5, the wafer element 201 has a hard mask (e.g., an oxide hardmask) 301 deposited thereon in the NFET region 210 and the PFET region 220. A mandrel 310 formed of semiconductor material, such as silicon or silicon germanium, is then patterned in the NFET region 210 and fins 320 formed of semiconductor material, such as silicon or silicon germanium, are patterned in the PFET region 220 using various patterning processes, such as those involving a sidewall image transfer (SIT) spacer. The patterning of the mandrel 310 and the fins 320 can be executed simultaneously or in sequence. In either case, the mandrel 310 can be provided as multiple mandrels 310 that extend along a length of the semiconductor layer 204 in the NFET region 210 and the fins 320 can be provided as multiple fins 320 that extend along a length of the semiconductor layer 204 in the PFET region 220.

Figure 6:
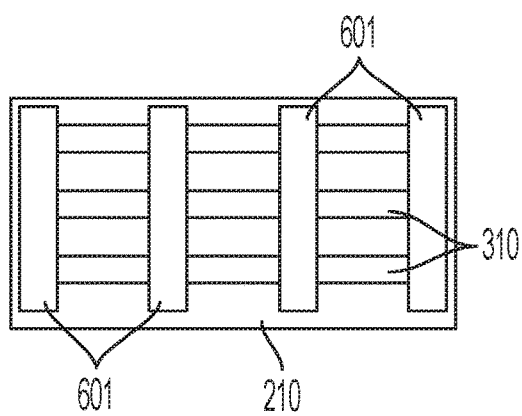
FIG. 6 is a top-down view of dummy gates around mandrels in an NFET region of a wafer element in accordance with embodiments of the present invention.
Figure 7:
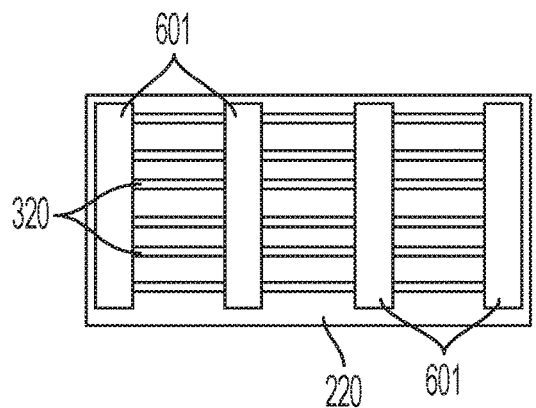
FIG. 7 is a top-down view of dummy gates around fins in a PFET region of a wafer element in accordance with embodiments of the present invention.

With reference to FIGS. 6 and 7, the hard mask 301 is removed from the PFET region 220 and a dummy gate 601 is deposited and patterned. In the NFET region 210, the dummy gate 601 can be provided as multiple dummy gates 601, with each of the multiple dummy gates 601 extending around each of the multiple mandrels 310 and each of the multiple dummy gates 601 being displaced from a neighboring dummy gate 601 by respective lengths of the multiple mandrels 310. In the PFET region 220, the dummy gate 601 can be provided as multiple dummy gates 601, with each of the multiple dummy gates 601 extending around each of the multiple fins 320 and each of the multiple dummy gates 601 being displaced from a neighboring dummy gate 601 by respective lengths of the multiple fins 320.

Figure 8:
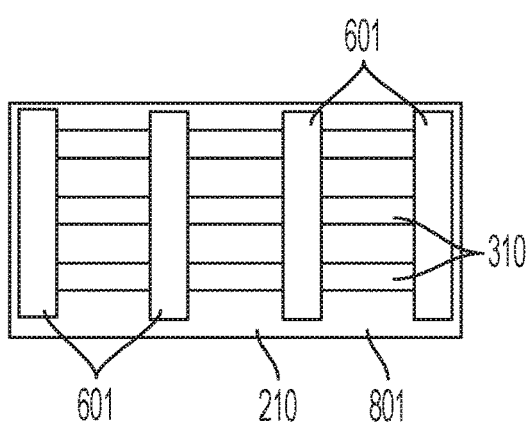
FIG. 8 is a top-down view of encapsulated dummy gates around mandrels in an NFET region of a wafer element in accordance with embodiments of the present invention.

With reference to FIG. 8, dielectric encapsulation is executed in the NFET region 210 to form a dielectric layer 801 that encapsulates the multiple mandrels 310 and the multiple dummy gates 601.

Figure 9:
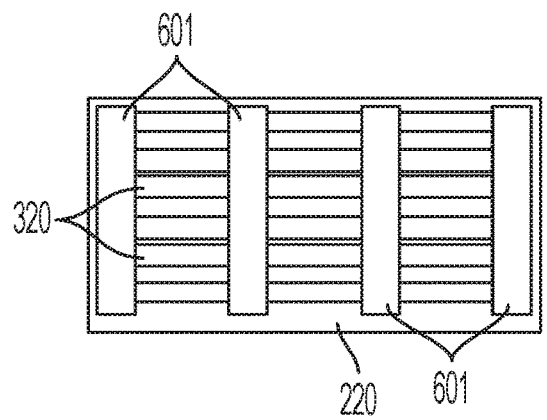
FIG. 9 is a top-down view of epitaxial growth in a PFET region of a wafer element in accordance with embodiments of the present invention.

With reference to FIG. 9, S/D epitaxy is grown in the PFET region 220 with optional thermal cycling. This results in the multiple fins 320 growing in size axial locations where the multiple fins 320 are exposed by the multiple dummy gates 601.

Figure 10:
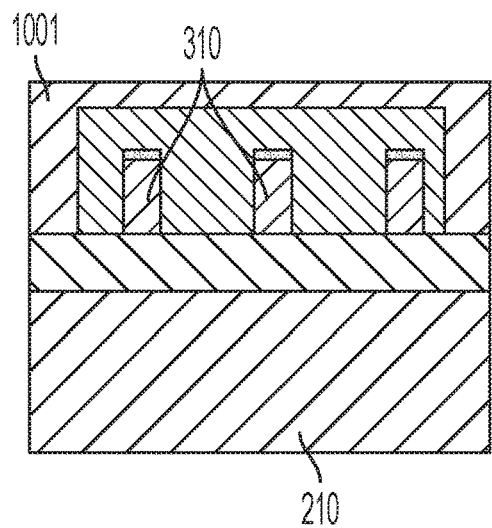
FIG. 10 is a cross-sectional view of inter-layer dielectric (ILD) deposited over encapsulated dummy gates around mandrels in an NFET region of a wafer element in accordance with embodiments of the present invention.
Figure 11:
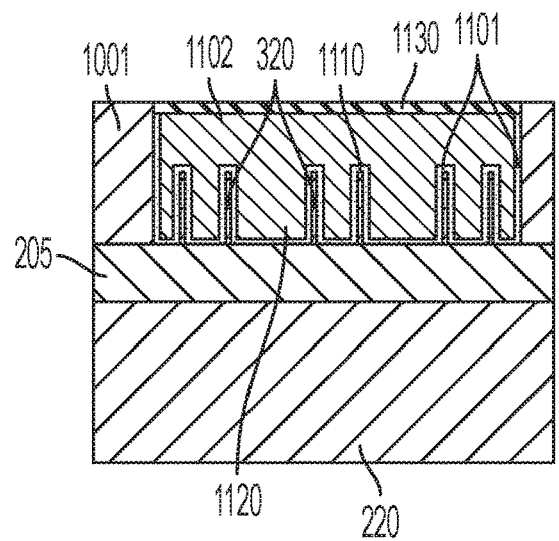
FIG. 11 is a cross-sectional view of capped gates in a PFET region of a wafer element in accordance with embodiments of the present invention.

With reference to FIGS. 10 and 11, ILD 1001 is deposited and planarized in the NFET region 210 and in the PFET region 220. Subsequently, as shown in FIG. 11, the PFET gate region 220 is opened through the ILD 1001 to expose the multiple fins 320 whereupon PFET gate dielectric 1101 and gate metal 1102 are sequentially deposited. The PFET gate dielectric 1101 thus forms a dielectric layer 1110 that lines interior surfaces of the ILD 1001, uppermost exposed surfaces of the insulator layer 205 and exterior surfaces of the multiple fins 320 and the gate metal 1102 forms a gate metal body 1120 that fills the region around the dielectric layer 1110. Once the PFET gate dielectric 1101 and the gate metal 1102 are deposited, the resulting structure can be planarized and capped by cap 1130.

The PFET region 220 is masked at this point and will be generally unaffected by any processes executed with respect to the NFET region 210 until later fabrication stages unless otherwise stipulated.

Figure 12:
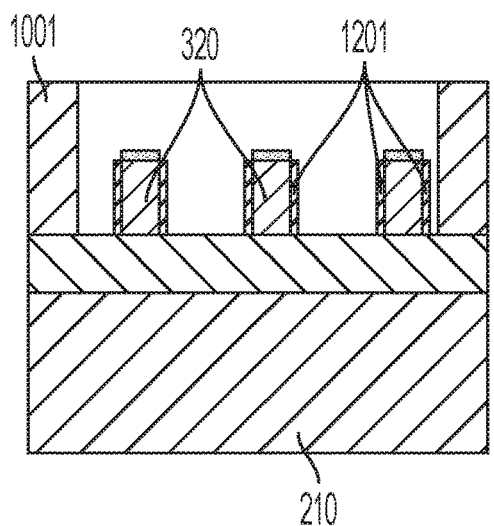
FIG. 12 is a cross-sectional view parallel to the gate and within the gate of undoped III-V semiconductor materials grown in an NFET region of a wafer element in accordance with embodiments of the present invention.
Figure 13:
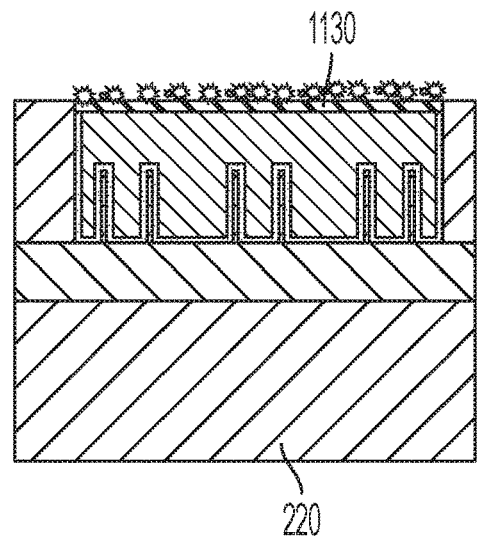
FIG. 13 is a cross-sectional view parallel to the gate and within the gate of unrequested growth being prevented over capped gates in a PFET region of a wafer element in accordance with embodiments of the present invention.

With reference to FIGS. 12 and 13, the multiple dummy gates 601 are pulled or removed from the NFET region 210 and III-V semiconductor materials are grown as III-V channel layers 1201 on the exposed silicon sidewalls of the multiple mandrels 310. Here, as noted above, III-V epitaxy process can be shortened due to relatively short channel widths required for fins. This relatively short channel length can ease epitaxial processes with single nucleation sites and minimized spurious epitaxial growth on nitride surfaces. A large nitride area, which is provided by the remaining hard mask 301 in the NFET region 210 and by the cap 1130 in the PFET region 220, allows spurious growth of the III-V semiconductor materials, which is easily removed by subsequent planarization.

Figure 14:
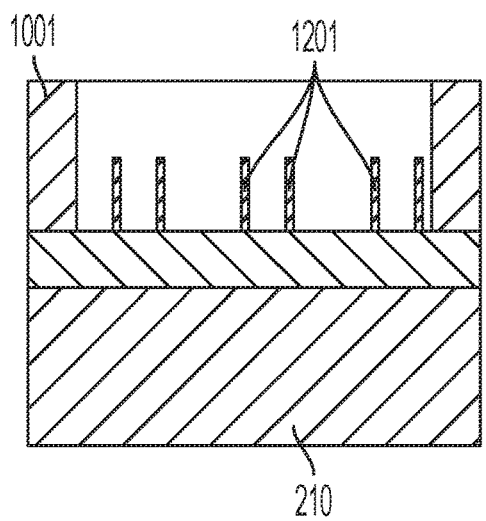
FIG. 14 is a cross-sectional view parallel to the gate and within the gate of mandrels pulled from an NFET region of the wafer element in accordance with embodiments of the present invention.

With reference to FIG. 14, the multiple mandrels 310 are directionally pulled or removed from between the III-V channel layers 1201 in the NFET region 210 while the grown III-V semiconductor materials of the III-V channel layers 1201 are left in place.

Figure 15:
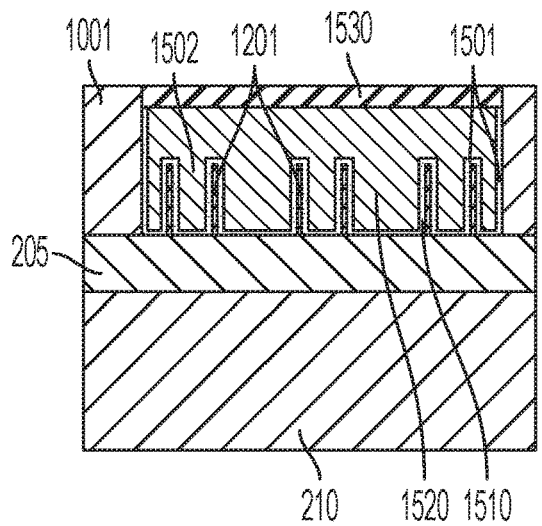
FIG. 15 is a cross-sectional view parallel to the gate and within the gate of capped gates in an NFET region of a wafer element in accordance with embodiments of the present invention.

With reference to FIG. 15, NFET gate dielectric 1501 and gate metal 1502 are sequentially deposited to form gate structures between the grown III-V semiconductor materials of the III-V channel layers 1201 that were previously left in place. The NFET gate dielectric 1501 thus forms a dielectric layer 1510 that lines interior surfaces of the ILD 1001, uppermost exposed surfaces of the insulator layer 205 and exterior surfaces of the III-V channel layers 1201 and the gate metal 1502 forms a gate metal body 1520 that fills the region around the dielectric layer 1510. Once the NFET gate dielectric 1501 and the gate metal 1502 are deposited, the resulting structure can be planarized, spurious III-V material polished from the nitride surfaces, and capped by cap 1530.

Figure 16:
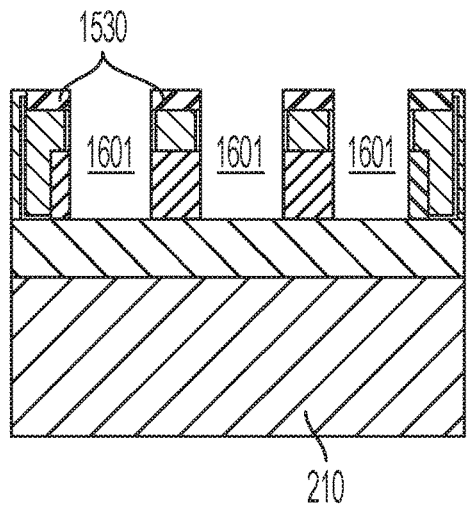
FIG. 16 is a cross-sectional view perpendicular to the gate and within the III-V fin of spaces for S/D contacts being recessed in an NFET region of a wafer element in accordance with embodiments of the present invention.

With reference to FIG. 16, spaces 1601 for S/D contacts are recessed in the NFET region 210.

Figure 17:
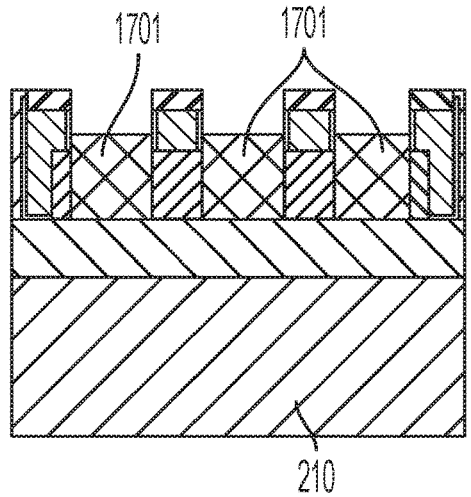
FIG. 17 is a cross-sectional view perpendicular to the gate and within the III-V fin of a III-V semiconductor materials grown in spaces for S/D contacts in an NFET region of a wafer element in accordance with embodiments of the present invention.

With reference to FIG. 17, once the spaces 1601 for the S/D contacts are recessed, the multiple mandrels 310 are pulled or removed from the NFET region 210 and n-type III-V semiconductor material is epitaxially grown to form III-V semiconductor material source/drain regions 1701. Here, it is to be understood that a fill shape area should have a sufficient amount of III-V semiconductor materials exposed in order to achieve proper loading for the III-V semiconductor material epitaxy.

Figure 18:
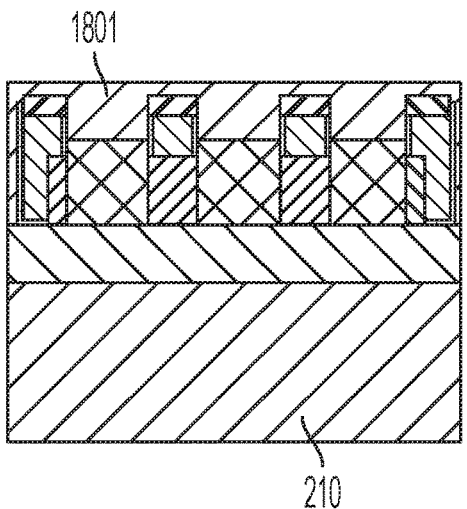
FIG. 18 is a cross-sectional view perpendicular to the gate and within the III-V fin of middle-of-line (MOL) dielectric deposited in an NFET region of a wafer element in accordance with embodiments of the present invention.
Figure 19:
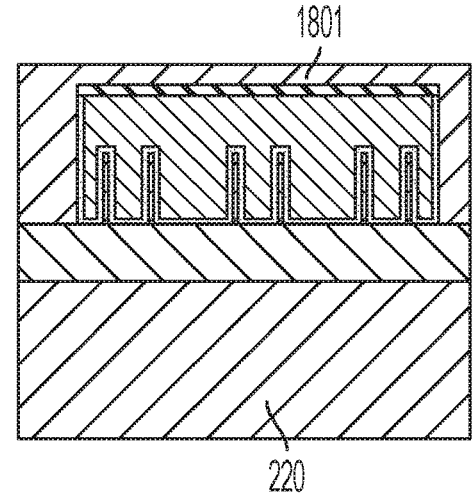
FIG. 19 is a cross-sectional view parallel to the gate and within the gate of middle-of-line (MOL) dielectric deposited in a NFET region of a wafer element in accordance with embodiments of the present invention.

With reference to FIGS. 18 and 19, MOL dielectric 1801 is deposited and planarized in the NFET region 210 and the PFET region 220 whereupon further patterning can be executed.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device in p- and n-type field effect transistor (PFET and NFET) regions of a wafer element, the method comprising:
    forming capped gate structures in the PFET region;
    growing III-V semiconductor materials on mandrel sidewalls in the NFET region while preventing III-V growth in the PFET region;
    pulling mandrels from gate spaces in which capped gate structures are formable in the NFET region;
    pulling the mandrels from source or drain (S/D) contact spaces in the NFET region; and
    growing III-V semiconductor materials in the S/D contact spaces in the NFET region while preventing III-V growth in the PFET region.

2. The method according to claim 1, wherein the mandrels comprise at least one of silicon or silicon germanium.

3. The method according to claim 1, wherein the III-V semiconductor materials comprise indium-gallium-arsenide (InGaAs).

4. The method according to claim 1, wherein:
    the pulling of the mandrels from the gate spaces in the NFET region comprises leaving the grown III-V semiconductor materials in place; and
    the forming of the capped gate structures in the gate spaces comprises forming the capped gate structures between the grown III-V semiconductor materials left in place.

5. The method according to claim 1 further comprising depositing and planarizing a middle-of-line (MOL) dielectric following the growing of the III-V semiconductor materials in the S/D contact spaces in the NFET region.

6. A method of fabricating a semiconductor device in p- and n-type field effect transistor (PFET and NFET) regions of a wafer element, the method comprising:
    forming fins and mandrels with dummy gates in the PFET and the NFET regions, respectively;
    forming capped gate structures around the fins in the PFET region with the NFET region blocked;
    growing III-V semiconductor materials on the mandrels in the NFET region while preventing III-V growth in the PFET region;
    pulling the mandrels from gate spaces in the NFET region;
    forming capped gate structures in the gate spaces;
    pulling the mandrels from source and drain (S/D) contact spaces in the NFET region; and
    growing III-V semiconductor materials in the S/D contact spaces in the NFET region while preventing III-V growth in the PFET region.

7. The method according to claim 6, wherein the fins comprise at least one of silicon or silicon germanium.

8. The method according to claim 6, wherein the mandrels comprise at least one of silicon or silicon germanium.

9. The method according to claim 6, wherein the III-V semiconductor materials comprise indium-gallium-arsenide (InGaAs).

10. The method according to claim 6, wherein the growing of the III-V semiconductor materials on the mandrels in the NFET region comprises growing the III-V semiconductor materials on sidewalls of the mandrels.

11. The method according to claim 10, wherein the pulling of the mandrels from the gate spaces in the NFET region comprises leaving the grown III-V semiconductor materials in place.

12. The method according to claim 11, wherein the forming of the capped gate structures in the gate spaces comprises forming the capped gate structures between the grown III-V semiconductor materials left in place.

13. The method according to claim 6, wherein a cap of the capped gate structures around the fins in the PFET and an interlayer dielectric (ILD) fill prevents the III-V growth in the PFET region.

14. The method according to claim 6, further comprising depositing and planarizing a middle-of-line (MOL) dielectric following the growing of the III-V semiconductor materials in the S/D contact spaces in the NFET region.

* * * * *